United States Patent
Kuhn

(12) 
(10) Patent No.: US 6,617,901 B1
(45) Date of Patent: Sep. 9, 2003

(54) MASTER/DUAL-SLAVE D TYPE FLIP-FLOP

(75) Inventor: Jay A. Kuhn, Seattle, WA (US)

(73) Assignee: Cypress Semiconductor Corp., San Jose, CA (US)

( * ) Notice: Subject to any disclaimer, the term of this patent is extended or adjusted under 35 U.S.C. 154(b) by 0 days.

(21) Appl. No.: 09/844,785

(22) Filed: Apr. 27, 2001

(51) Int. Cl.$^7$ ........................ H03K 3/289; H03K 3/356
(52) U.S. Cl. ........................................ 327/202; 327/203
(58) Field of Search ........................ 327/202, 203, 327/208, 209, 218, 12, 199, 200, 201, 210, 211, 212

(56) References Cited

U.S. PATENT DOCUMENTS

| | | | |
|---|---|---|---|
| 4,627,030 A | * 12/1986 | Barber | 365/154 |
| 4,656,368 A | 4/1987 | McCombs et al. | 327/203 |
| 4,700,346 A | 10/1987 | Chandran et al. | 714/816 |
| 4,873,456 A | * 10/1989 | Olisar et al. | 327/202 |
| 4,973,860 A | 11/1990 | Ludwig | 327/145 |
| 4,980,577 A | 12/1990 | Baxter | 327/198 |
| 5,025,174 A | * 6/1991 | Shikata | 327/203 |
| 5,036,217 A | 7/1991 | Rollins et al. | 327/203 |
| 5,059,833 A | * 10/1991 | Fujii | 327/7 |
| 5,331,669 A | 7/1994 | Wang et al. | 375/118 |
| 5,384,781 A | 1/1995 | Kawabata | 714/700 |
| 5,418,825 A | 5/1995 | Cantrell et al. | 377/48 |
| 5,424,996 A | 6/1995 | Martin et al. | 365/233 |
| 5,576,651 A | * 11/1996 | Phillips | 327/202 |
| 5,586,081 A | 12/1996 | Mills et al. | 365/230.08 |
| 5,598,120 A | 1/1997 | Yurash | 327/202 |
| 5,825,224 A | 10/1998 | Klass et al. | 327/200 |
| 6,163,550 A | 12/2000 | Alston et al. | 370/503 |
| 6,404,253 B1 | 6/2002 | Hwang et al. | 327/203 |
| 6,448,820 B1 | * 9/2002 | Wang et al. | 327/12 |
| 6,522,184 B2 | 2/2003 | Sato | 327/203 |

FOREIGN PATENT DOCUMENTS

| | | | |
|---|---|---|---|
| JP | 62-262511 | * 11/1987 | 327/208 |

* cited by examiner

*Primary Examiner*—Tuan T. Lam
(74) *Attorney, Agent, or Firm*—Christopher P. Maiorana, P.C.

(57) ABSTRACT

An apparatus comprising a first circuit, a second circuit and a third circuit. The first circuit may be configured to receive a first input signal and a second input signal and present a first signal and a second signal. The second circuit may be configured to present a first output signal in response to the first input signal, the first signal and the second signal. The third circuit may be configured to present a second output signal in response to the second input signal, the first signal and the second signal.

18 Claims, 3 Drawing Sheets

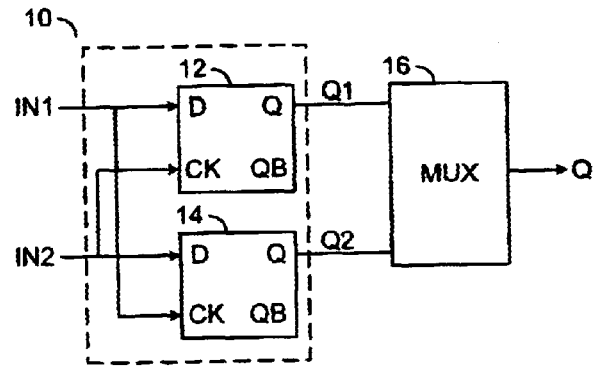
(CONVENTIONAL)
FIG. 1
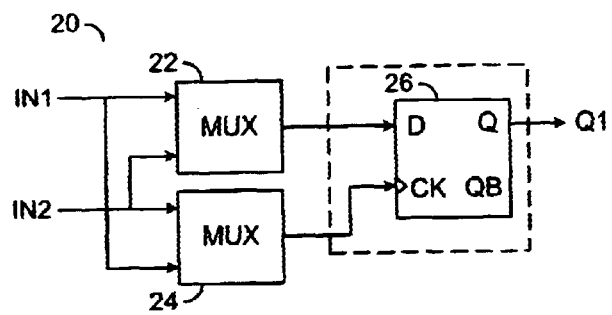
(CONVENTIONAL)
FIG. 2
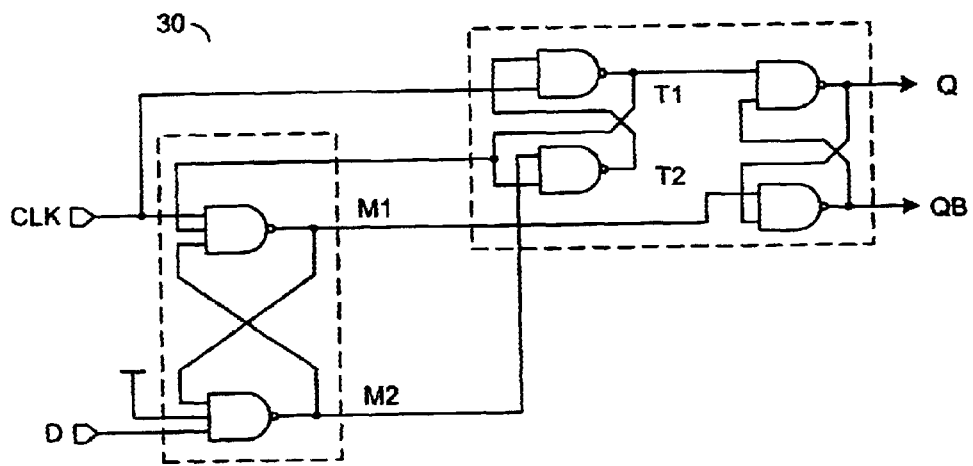
(CONVENTIONAL)
FIG. 3

MASTER/DUAL-SLAVE D TYPE FLIP-FLOP

FIELD OF THE INVENTION

The present invention relates to a method and/or architecture for implementing storage elements generally and, more particularly, to a method and/or architecture for implementing a master/dual-slave D type flip-flop that may choose which input is a clock input and which input is a data input.

BACKGROUND OF THE INVENTION

Referring to FIG. 1, a conventional circuit 10 is shown implementing a flip-flop 12 and a flip-flop 14. The flip-flops 12 and 14 are cross-coupled. The flip-flops 12 and 14 double the load capacitance presented to the previous stage. The flip-flops 12 and 14 are triggered in response to the input signals IN1 and IN2. The circuit 10 provides one solution for selecting which input is a clock input and which input is a data input. A multiplexer 16 is implemented to select which output (Q1 or Q2) is selected. It is desirable to implement large transistors in the flip-flops 12 and 14 to provide high speed and accurate current matching. However, doubling the load of the circuit 10 is a severe disadvantage in current consumption and speed.

Referring to FIG. 2, another conventional circuit 20 with high time skew and noise is shown. The multiplexers 22 and 24 on the input paths IN1 and IN2 select which signal to present to the clock input and which signal to present to the data input of the flip-flop 26. The flip-flop 26 acts as a time discriminator for the circuit 20. However, the multiplexers 22 and 24 add extra delay and hence potential timing skew. The multiplexers 22 and 24 also need to be large to drive the large size of input transistors of the flip-flop 26. The multiplexers 22 and 24 increase jitter of the circuit 20. Furthermore, in other conventional implementations, the multiplexers 22 and 24 can be added before and/or after the flip-flop 26.

Referring to FIG. 3, a schematic of a conventional master/slave flip-flop 30 is shown. The circuit 30 may be similar to the flip-flops 12, 14 and 26. Conventional master/slave flip-flop configurations, such as the circuit 10 or the circuit 20, have one or more of the following disadvantages of requiring (i) additional circuitry for a dual load device, (ii) multiplexers on the inputs that have the potential to disrupt setup times and add skew between reference and feedback signals, and/or (iii) implementing two flip-flops in parallel which doubles the load capacitance seen by the inputs, which slows down the proceeding circuitry which increases time skews and increases susceptibility to noise.

SUMMARY OF THE INVENTION

The present invention concerns an apparatus comprising a first circuit, a second circuit and a third circuit. The first circuit may be configured to receive a first input signal and a second input signal and present a first signal and a second signal. The second circuit may be configured to present a first output signal in response to the first input signal, the first signal and the second signal. The third circuit may be configured to present a second output signal in response to the second input signal, the first signal and the second signal.

The objects, features and advantages of the present invention include providing a method and/or architecture for implementing a flip-flop that may choose which input acts as a clock input and which input acts as a data input and may (i) provide a CMOS master/dual-slave D type flip-flop, (ii) provide functionality of two D type flip-flops connected in parallel, (iii) have reduced load capacitance, (iv) require less circuitry, (v) have minimal circuit overhead, (vi) not increase input loading over a single D flip-flop, (vii) provide symmetrical design with potentially zero input timing skew, and/or (viii) be implemented without multiplexers on the input.

BRIEF DESCRIPTION OF THE DRAWINGS

These and other objects, features and advantages of the present invention will be apparent from the following detailed description and the appended claims and drawings in which:

FIG. 1 is a block diagram of a conventional parallel flip-flop configuration;

FIG. 2 is a block diagram of a conventional multiplexed flip-flop configuration;

FIG. 3 is a schematic of a conventional master/slave flip-flop configuration;

DETAILED DESCRIPTION OF THE PREFERRED EMBODIMENTS

Figure 4:
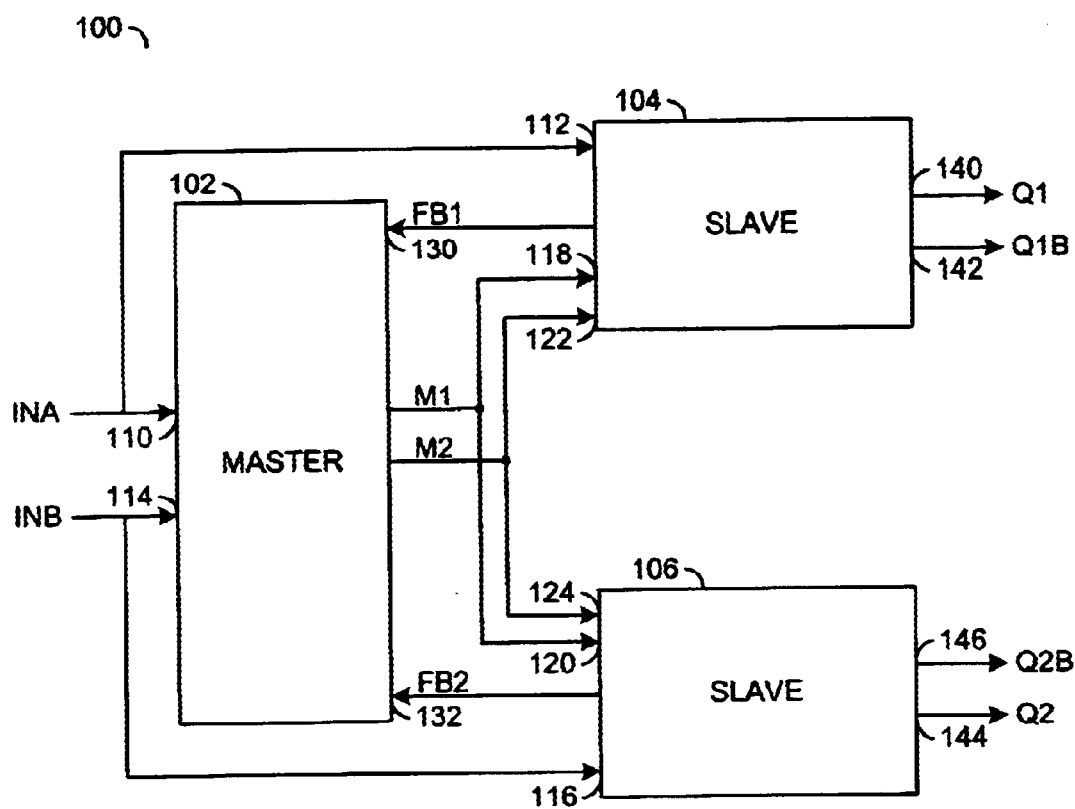
FIG. 4 is a block diagram of a preferred embodiment of the present invention.

Referring to FIG. 4, a block diagram of a circuit (or system) 100 is shown in accordance with a preferred embodiment of the present invention. The circuit 100 generally comprises a master block (or circuit) 102, a slave block (or circuit) 104 and a slave block (or circuit) 106. The blocks 102, 104 and 106 may be implemented as flip-flops, latches, or other appropriate type devices. An input signal (e.g., INA) may be presented to an input 110 of the master circuit 102 as well as to an input 112 of the slave circuit 104. A second input signal (e.g., INB) may be presented to an input 114 of the master circuit 102 as well as to an input 116 of the slave circuit 106. The circuit 100 may receive a clock input at either the input INA or the input INB (e.g., the inputs INA and INB are interchangeable). Also, the circuit 100 may receive a data input at either the input INA or the input INB.

The system 100 may provide the functionality of two cross-coupled D type flip-flops with a load of a single flip-flop.

The system 100 may allow accurate comparisons of arrival times of two signals (e.g., the signals INA and INB). Further, either of the signals INA or INB may be toggled at a higher frequency than the other signal. The higher frequency signal INA or INB may then be known to the circuit 100 such that an appropriate output can be selected. For example, the system 100 may allow digital circuitry (to be discussed in connection with FIG. 5) to select which output to implement. Additionally, the system 100 may be particularly useful for phase comparison in de-skewing a zero delay buffer.

The master circuit 102 may present a signal (e.g., M1) to an input 118 of the slave circuit 104 as well as to an input 120 of the slave circuit 106. The master circuit 102 may also present a signal (e.g., M2) to an input 122 of the slave circuit 104 as well as to an input 124 of the slave circuit 106. The slave circuit 104 may present a signal (e.g., FB1) to an input 130 of the master circuit 102. Similarly, the slave circuit 106 may present a signal (e.g., FB2) to an input 132 of the master circuit 102. The master circuit 102 may load both the slave circuit 104 and the slave circuit 106. The slave circuit 104 may present a first output signal (e.g., Q1) at an output 140 and a second output signal (e.g., Q1b) at an output 142. The signals Q1 and Q1b are generally complementary signals. Similarly, the slave circuit 106 may present a first output signal (e.g., Q2) at an output 144 and a second output signal (e.g., Q2b) at an output 156. The signals Q2 and Q2b may be complementary signals.

The slave circuit 106 may be similar to the slave circuit 104. The slave circuits 104 and 106 may be configured such that the circuit 100 is symmetric. Symmetry of the circuit 100 generally reduces input skew and provides a balanced system.

The circuit 100 may have low set up times such that relative phases of the signals INA and INB are compared accurately. The circuit 100 may also provide an enhancement to a standard D type master/slave flip-flop configurations by adding a second slave unit (e.g., the slave unit 106). The transfer of data to the first slave unit 104 may be sensitive to transitions on the signal INA thus operating as a normal flip-flop. The second slave unit 106 may be sensitive to changes on the signal INB. Thus, the functionality of the second flip-flop circuit 106 is obtained with no extra loading and a minimum of extra circuitry.

Figure 5:
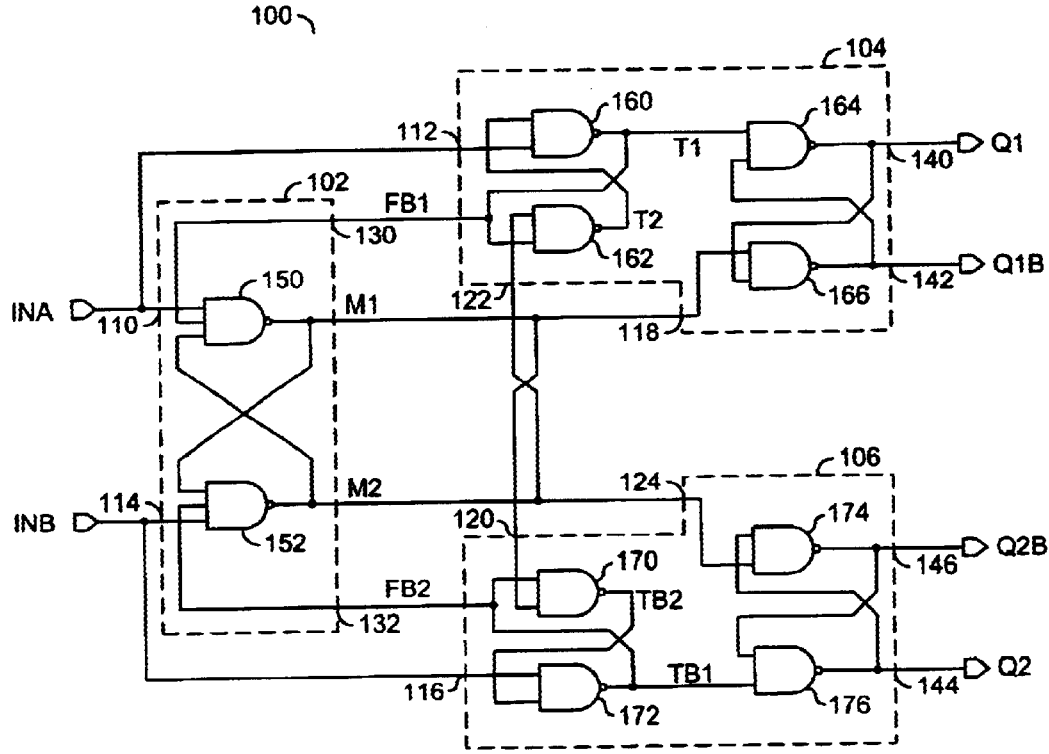
FIG. 5 is a schematic of the present invention.

Referring to FIG. 5, a schematic of the circuit 100 is shown. The master circuit 102 generally comprises a gate 150 and a gate 152. The gates 150 and 152 may be NAND gates. However, other gates may be implemented accordingly to meet the design criteria of a particular implementation. The gate 150 may receive the signal INA, the signal FB1 and the signal M2. The gate 150 may also present the signal M1. The gate 152 may receive the signal INB, the signal FB2 and the signal M1. The gate 152 may also present the signal M2.

The slave circuit 104 generally comprises a gate 160, a gate 162, a gate 164 and a gate 166. The gates 160–166 may be implemented as NAND gates. However, other gates may be implemented accordingly to meet the design criteria of a particular implementation. The gate 160 generally presents a signal (e.g., T1) to the gate 164, to the gate 162, as well as to the circuit 102. The signal T1 may be presented to the circuit 102 via the signal FB1. The gate 162 may present a signal (e.g., T2) to the gate 160. The gate 164 generally presents the signal Q1 to the output 140 as well as to the gate 166. The gate 166 generally presents the signal Q1b to the output 142 as well as to the gate 164. The circuit 106 generally comprises a gate 170, a gate 172, a gate 174 and a gate 176. The gates 170–176 are configured similarly to the gates 160–166.

Each of the signals of the present invention may be referred to as a voltage or a node, a node voltage, a node, a voltage, or other appropriate signal. The gates 150 and 152 may represent a master latch. The gates 160 and 162 may represent a transfer latch and the gates 164 and 166 may represent a slave latch. When the signal INA is low the master signal M1 and the signal T1 are generally high. Therefore the slave latch 164, 166 may retain a previous value. Output data for a D flip-flop may change on the rising edge of a clock input. Thus, when the signal INA rises, the output Q1 may take on the value of the input INB.

When the input INB is low, before the signal INA transitions, both master signals M1 and M2 are high, since both input signals INB and INA are low. When the signal INA transitions high, the signal M1 generally transitions low, forcing the signal M2 to remain high. The signal M1 transitioning low may toggle the state of the slave latch 164, 166 such that the signal Q1 transitions low and the signal Q1b transitions high. The signal Q1 may then represent the input INB. As long as the signal INA remains high, changes in the input signal INB may not affect the outputs Q1 and Q1b (e.g., since when the signal M1 is low, the signal M2 is forced high regardless of the state of input signal INB) When the signal INA returns low, the state of the signal s M1 and M2 may change depending on the state of input signal INB. A transition of the signal M1 to low may not affect the outputs Q1, Q1b, Q1, Q2b. A transition in the signal M2 to low may change the state of the signal T2. However, the signal T1 may remain high, since the signal INA is low. Thus, the outputs Q1 and Q1b generally change only on the rising edge of the signal INA.

If the input INB transitions high before the clock signal INA, the signal M2 may transition low and the signal M1 may remain high (the opposite of the input INA case). However, the transition may not cause a change in the slave latches 164 and 166. The signal M2 transitioning low may force the signal T2 high. However, the transition may not change the signal T1 since the signal INA is low (e.g., the signal T1 remains high). When the signal INA transitions high, the signal T1 may transition low since both inputs to the gate 160 are high. The transfer signal T1 may transition low forcing the signal Q1 high. The transition may ensure the slave latch 164, 166 has a Q1 low state and Q1b high state. Thus, the signal Q1 assumes the value of the input INB when the signal INB transitions high, illustrating correct behavior of a D flip-flop.

When the transfer signal T1 transitions low the signal M1 may be forced high. If the input INA returns to low while the input INB remains high, the signal M2 may transition high. However, the transition may not affect the state of the transfer latch 160, 162. The output T2 may remain high and the output T1 may remain low. When the signal T1 is low, the signal M1 may remain high and there may be no effect on the slave latch 164, 166. Similarly, if the signal INA transitions low before the input INB then the signals M1 and T1 are forced to remain high and there is no change in the slave latch 164, 166.

From the symmetry of the additional gates (e.g., the gates 170–176) the behavior of Q2 and Q2b will be similar to Q1 and Q1b except the inputs INA and INB will be reversed. For the slave latch 106, if the input INA is low and the signal INB transitions high, the signal M2 may transition low and the signal M1 may remain high. The transition may force the signal Q2b high and force the signal Q2 low, reflecting the state of the signal INA. If the signal INA transitions high before the signal INB, the signal M1 may transition low forcing the signal M2 to remain high. When the signal D transitions high, the signal TB1 may transition low. The transition may force the signal Q2 high and the signal Q2b low. Thus, the signal Q2 is the sampled value of the signal INA.

The signals Q2 and Q2b may reflect typical D type flip-flop behavior. However, the circuit 106 may operate in a reverse sense of the circuit 104. The circuit 100 may allow the operation of two separate flip-flops (e.g., the circuit 104 and the circuit 106).

The circuit 100 may provide the functionality of two D flip-flops connected in parallel with data and clock inputs reversed without extra load capacitance. Furthermore, the circuit 100 may require less circuitry to implement a master/dual-slave implementation than conventional approaches. The circuit 100 may provide the functionality of two cross-couple D type flip-flops with minimal circuit overhead. The circuit 100 may not increase input loading over a single D flip-flop. Additionally, the circuit 100 may provide a symmetrical design with theoretically zero input timing skew.

The various signals of the present invention are generally "on" (e.g., a digital HIGH, or 1) or "off" (e.g., a digital LOW, or 0). However, the particular polarities of the on (e.g., asserted) and off (e.g., de-asserted) states of the signals may be adjusted (e.g., reversed) accordingly to meet the design criteria of a particular implementation.

While the invention has been particularly shown and described with reference to the preferred embodiments thereof, it will be understood by those skilled in the art that various changes in form and details may be made without departing from the spirit and scope of the invention.

What is claimed is:

1. An apparatus comprising:
   a first circuit configured to receive a first input signal and a second input signal and present a first signal and a second signal;
   a second circuit (i) comprising a first slave latch and a first transfer latch (ii) configured to present a first output signal in response to said first input signal, said first signal and said second signal; and
   a third circuit (i) comprising a second slave latch and a second transfer latch (ii) configured to present a second output signal in response to said second input signal, said first signal and said second signal.

2. The apparatus according to claim 1, wherein said first input signal comprises a clock signal and said second input signal comprises a data signal.

3. The apparatus according to claim 1, wherein said first and second input signals are interchangeable.

4. The apparatus according to claim 1, wherein said first circuit comprises a master circuit, said second circuit comprises a first slave circuit and said third circuit comprises a second slave circuit.

5. The apparatus according to claim 4, wherein said master circuit comprises a master flip-flop, said second slave circuit comprises a slave flip-flop and said third slave circuit comprises a slave flip-flop.

6. The apparatus according to claim 1, wherein said apparatus comprises a master/dual-slave D type flip-flop.

7. The apparatus according to claim 1, wherein said first circuit is further configured in response to a first feedback signal and a second feedback signal.

8. The apparatus according to claim 7, wherein said second circuit is further configured to generate said first feedback signal and said third circuit is further configured to generate said second feedback signal.

9. The apparatus according to claim 1, wherein said second circuit and said third circuit comprise symmetric designs.

10. The apparatus according to claim 1, wherein said second circuit and said third circuit are cross coupled.

11. The apparatus according to claim 1, wherein:
    said first circuit comprises a master latch configured to generate said first and second signals in response to said first and second input signals;
    said second circuit comprises said first slave latch and said first transfer latch coupled in series and configured to generate said first output signal in response to said first input signal, said first signal, and said second signal; and
    said third circuit comprises said second slave latch and said second transfer latch coupled in series and configured to generate said second output signal in response to said second input signal, said first signal, and said second signal.

12. The apparatus according to claim 1, wherein said first output signal comprises a complementary output pair and said second output signal comprises a complementary output pair.

13. The apparatus according to claim 1, wherein said apparatus is configured to provide theoretically zero input timing skew.

14. A method for providing a master/dual-slave flip-flop, comprising the steps of:
    (A) presenting a first signal and a second signal in response to a first input signal and a second input signal;
    (B) presenting a first output signal using a first slave latch and a first transfer latch, in response to said first input signal, said first signal and said second signal; and
    (C) presenting a second output signal using a second slave latch and a second transfer latch, in response to said second input signal, said first signal and said second signal.

15. The method according to claim 14, wherein step (A) comprises a master step, step (B) comprises a slave step and step (C) comprises a slave step.

16. The method according to claim 14, wherein step (A) is further responsive to a first feedback signal and a second feedback signal.

17. The method according to claim 14, wherein step (B) further comprises generating said first feedback signal and step (C) further comprises generating said second feedback signal.

18. An apparatus comprising:
    a first circuit configured to receive a first input signal and a second input signal and present a first signal and a second signal;
    a second circuit configured to present a first output signal in response to said first input signal, said first signal and said second signal; and
    a third circuit configured to present a second output signal in response to said second input signal, said first signal and said second signal, wherein said first output signal comprises a complementary output pair and said second output signal comprises a complementary output pair.

* * * * *